United States Patent
Reynders et al.

(10) Patent No.: US 7,405,914 B2
(45) Date of Patent: Jul. 29, 2008

(54) ELECTROSTATIC DISCHARGE PROTECTION CIRCUIT

(75) Inventors: Koen Reynders, Oudenaarde (BE); Mahmud Zubeidat, Brussels (BE); Vincent De Heyn, Braives (BE)

(73) Assignees: Interuniversitair Microelektronica Centrum (IMEC), Leuven (BE); AMI Semiconductor, Oudenaarde (BE)

( * ) Notice: Subject to any disclaimer, the term of this patent is extended or adjusted under 35 U.S.C. 154(b) by 460 days.

(21) Appl. No.: 10/857,409

(22) Filed: May 28, 2004

(65) Prior Publication Data

US 2005/0002141 A1 Jan. 6, 2005

(30) Foreign Application Priority Data

May 28, 2003 (EP) .................................. 03447134

(51) Int. Cl.
- H02H 3/20 (2006.01)
- H02H 9/00 (2006.01)
- H02H 9/04 (2006.01)

(52) U.S. Cl. .................. 361/56; 361/111; 361/91.1
(58) Field of Classification Search ............. 361/56, 361/111, 91.1
See application file for complete search history.

(56) References Cited

U.S. PATENT DOCUMENTS

| | | | | |
|---|---|---|---|---|
| 5,359,211 | A * | 10/1994 | Croft | ............... 257/173 |
| 6,225,642 | B1 * | 5/2001 | Liao | ................... 257/3 |
| 6,410,398 | B1 * | 6/2002 | Forel et al. | ........... 438/382 |
| 6,577,481 | B2 * | 6/2003 | Steinhoff et al. | ........ 361/56 |
| 2002/0060890 | A1 | 5/2002 | Steinhoff et al. | |

FOREIGN PATENT DOCUMENTS

| | | |
|---|---|---|
| DE | 298715 | 10/1983 |
| EP | 0 651 490 A1 | 5/1995 |
| EP | 0 892 436 A2 | 1/1999 |
| GB | 1393748 | * 6/1972 |

OTHER PUBLICATIONS

A. Sedra et al., Microelectronic Circuits, 1987, CBS College Publishing, pp. 408-410.*
The Authoritattive Dictionary of IEEE Standard Terms, 2000, IEEE Press, p. 128.*
European Search Report for EP 03 44 7134, application of Interuniversitair Micro-Elektronica Centrum, dated Nov. 12, 2003.
ESD protection structures for BCD5 smart power technologies, L. Sponton et al., Microelectronics Reliability 41 (2001) 1683-1687.

* cited by examiner

Primary Examiner—Michael Sherry
Assistant Examiner—Zeev Kitov
(74) Attorney, Agent, or Firm—McDonnell Boehnen Hulbert & Berghoff LLP (57) ABSTRACT

An electrostatic discharge (ESD) protection circuit for the protection of an electronic circuit from an ESD event. The electronic circuit, in operation, is provided with a supply voltage and a reference voltage (typically electrical ground) via voltage terminals and/or power supply buses. The protection circuit includes two bipolar transistors in series, where the transistors are coupled between the supply voltage terminal/bus and the reference voltage terminal/bus. The bases of the transistors are coupled via a connection including two resistors in series, where the connection point between the two resistors is coupled with the connection point between the two transistors.

18 Claims, 8 Drawing Sheets

FIG. 1a    FIG. 1b

Prior Art

ELECTROSTATIC DISCHARGE PROTECTION CIRCUIT

CROSS REFERENCE TO RELATED APPLICATIONS

This application claims priority benefits under 35 U.S.C. 119(a) to European Patent Application EP 03447134.2, filed May 28, 2003.

BACKGROUND

I. Field of the Invention

This invention is related to protection devices/circuits and, more particularly, to protection circuits for protecting an electronic circuit, such as an integrated circuit, from an electrostatic discharge (ESD) event.

II. Description of Related Art

ESD protection devices and/or circuits are important to preventing the failure of many electronic components. Integrated circuits (ICs) in particular need to be protected against ESD pulses that occur during manufacturing operations associated with such components. Various techniques and approaches have been employed to protect electronic circuits, particularly ICs from such ESD pulses.

One type of protection that is employed for ESD protection is the use of power supply protection circuits, which are typically included on-chip (e.g., on the IC itself) to keep ESD pulses from damaging the IC's during physical manipulation of the ICs. Many of such protection circuits operate based on a 'snap-back' behavior of the protection device/circuit. As is known, snap-back occurs in such devices/circuits once a given voltage level is exceeded. An additional aspect of power supply protection devices/circuits is that they are latch-up safe (e.g., so that they are not triggered and then remain on for an extended duration during normal operation of the circuit they are protecting). Latch-up is a known phenomenon that may occur in parasitic bipolar devices that are inherently created in the physical layout of ICs. Thus, when power supply protection devices/circuits with a snap-back behavior are used, the holding voltage of those protection devices/circuits must be higher than the supply voltage ($V_{DD}$) in order for such protection devices/circuits to be "latch-up safe."

In harsh operating environments, such as automotive environments, ESD power supply protection devices/circuits (e.g., such as those using snap-back devices) may trigger during normal operation due to over voltage conditions that occur due to the harsh operating environment. In this situation, if the power supply protection device/circuit clamps the voltage to a value at, or below the operating voltage, the protection circuit would "latch-up" and destroy the IC due to a large DC supply current flowing directly from the power supply terminal to the reference voltage terminal (e.g., electrical ground) through the ESD protection circuit. Therefore, a holding voltage that is sufficiently higher than the nominal supply voltage to prevent such latch-up is desirable for ESD power supply protection devices/circuits operating in such harsh environments.

In the automotive industry, 42V battery supply voltages are becoming common. Thus, for ICs or electronic circuits employed in this environment, a holding voltage of at least 50V for ESD power supply protection circuits using snapback devices is desirable. This high holding voltage, along with the requirement of many automotive manufacturers for high ESD current dissipation capability (e.g., the ability to sustain a human body model ESD pulse of >4 kV), power supply protection devices/circuits that have a power dissipation capability of 150 W or more in a 100 ns time period are necessary.

One type of protection circuit that has been implemented in such environments is 'active clamp' circuits. Such active clamps, which are essentially over-sized bipolar or double-diffused metal-oxide-semiconductor (DMOS) transistors, are capable of safely operating under very high ESD currents. Also, because they do not operate based on snap-back behavior, they are not particularly susceptible to latch-up. However, such devices, when implemented in an integrated-circuit (IC) consume a relatively large silicon area and, therefore, are expensive to employ. Therefore, ESD protection circuits that satisfy harsh environment performance criteria (e.g., the automotive criteria discussed above) that may be implemented in a cost effective way (e.g., with relatively little silicon area) are desirable.

SUMMARY

An ESD protection circuit for the protection of an electronic circuit or integrated circuit (IC) from electrostatic discharge (ESD) events is provided. In operation, the electronic circuit/IC is powered by a supply voltage ($V_{DD}$), with respect to a reference voltage ($V_{ss}$) via power supply terminals/buses. The protection circuit includes at least two bipolar transistors coupled in series, where each two neighboring transistors are coupled, in serial fashion, through a first connection between the collector of a first of the two transistors and the emitter of a second of the two transistors. For the situation where only two transistors are used, the emitter of the first transistor is coupled with the $V_{ss}$ terminal/bus, while the collector of the second transistor is coupled with the $V_{DD}$ terminal/bus.

The bases of the two transistors (for the two transistor configuration discussed above) are coupled via two serially connected resistors. A second connection couples the first resistor to the base of the second transistor. A third connection couples the second resistor to the first resistor. A fourth connection couples the first connection (between the collector of the first transistor and the emitter of the second transistor) and the third connection (between the two resistors). A fifth connection couples the second resistor with the base of the first transistor.

The ESD protection circuit may further include one or more capacitors, where each capacitor is coupled between the $V_{DD}$ terminal/bus, to which one of the transistors is directly connected (e.g., the second transistor in the above-described two transistor configuration), and the base of one or more of the other transistors (e.g., the first transistor in the above-described two transistor configuration).

An alternative ESD protection circuit may further include one or more gate coupled double-diffused metal-oxide-semiconductor (DMOS) transistors, where each DMOS transistor is coupled between the $V_{DD}$ terminal/bus, to which one of the transistors is directly connected (e.g., the second transistor in the above-described two transistor configuration), and the base of one or more of the other transistors (e.g., the first transistor in the above-described two transistor configuration). Such protections circuits employ a relatively small amount of silicon area, as compared to active-clamp circuits, will dissipate high ESD currents (e.g., a 4 kV HBM pulse) and may be implemented so as to have holding voltages greater than 50V, as was discussed above.

These and other aspects will become apparent to those of ordinary skill in the art by reading the following detailed description, with reference, where appropriate, to the accompanying drawings. Further, it should be understood that the embodiments noted in this summary are not intended to limit the scope of the invention as claimed.

BRIEF DESCRIPTION OF THE DRAWINGS

FIGS. 1a and 1b are diagrams illustrating a prior art ESD protection device with a single bipolar transistor, where FIG. 1a illustrates the electrical schematic and FIG. 1b illustrates the physical device;

FIGS. 3a and 3b are diagrams illustrating an ESD protection device in accordance with an embodiment of the invention, where FIG. 3a illustrates the electrical schematic and FIG. 3B illustrates the physical device;

DETAILED DESCRIPTION

ESD Protection Circuit with Two Bipolar Transistors

Figures 1A, 1B:
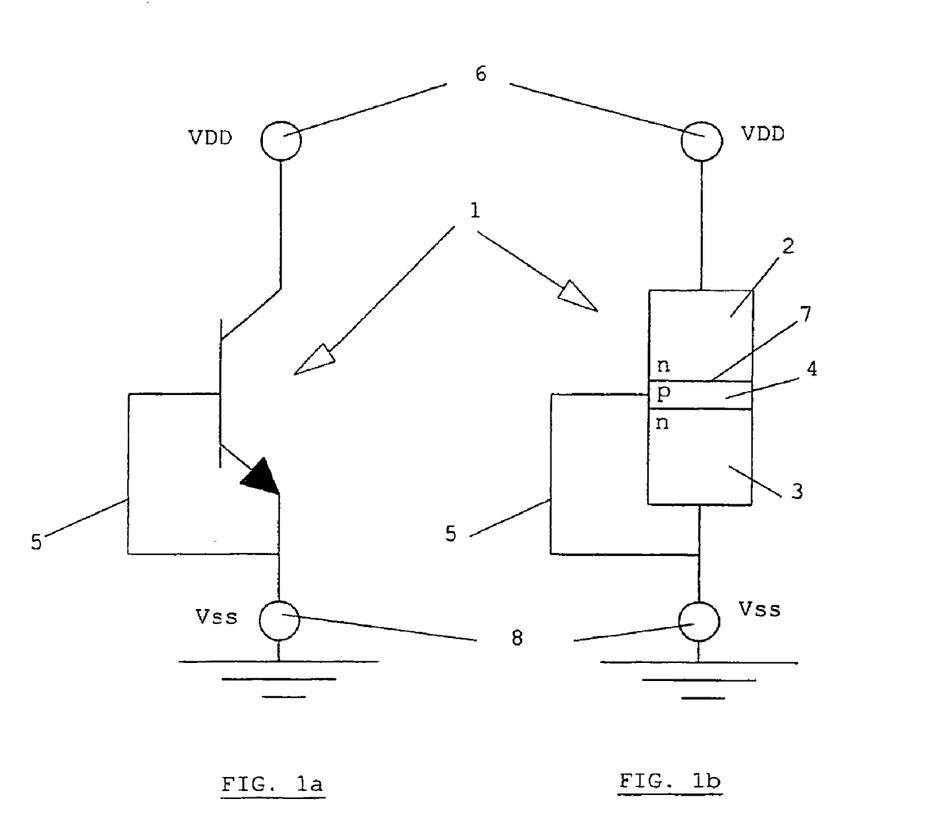

Referring to FIGS. 1a and 1b, diagrams that illustrate a prior art ESD protection device based on a single bipolar NPN transistor 1 are shown. FIG. 1a is a schematic diagram of the protection device, while FIG. 1b is a diagram illustrating the physical structure of the protection device. The NPN transistor 1 is coupled, in the same fashion as the devices of the electronic circuit it protects (which are not shown). Specifically, the NPN transistor 1 is coupled between a reference voltage ($V_{ss}$) terminal 8 (which typically corresponds to electrical ground) and a power supply voltage ($V_{DD}$) terminal 6. The $V_{DD}$ terminal 6 and the $V_{ss}$ terminal 8 may also take the form of power supply buses in an integrated circuit (IC) being protected by the NPN transistor 1. The $V_{DD}$ terminal 6 and the $V_{ss}$ terminal 8 are respectively coupled with a collector 2 and an emitter 3 of the transistor 1. A base 4 of the NPN transistor 1 is connected to the emitter 3 with a conductor 5.

It will be appreciated that the bipolar NPN transistors of the protection circuits described herein may be readily replaced using bipolar PNP transistors and making appropriate changes to the connections of the PNP transistors. Further, the ESD protection circuits described herein would typically be implemented on an IC manufactured with a given semi-conductor technology and have a physical structure that is specifically adapted to the given technology.

Figure 2:
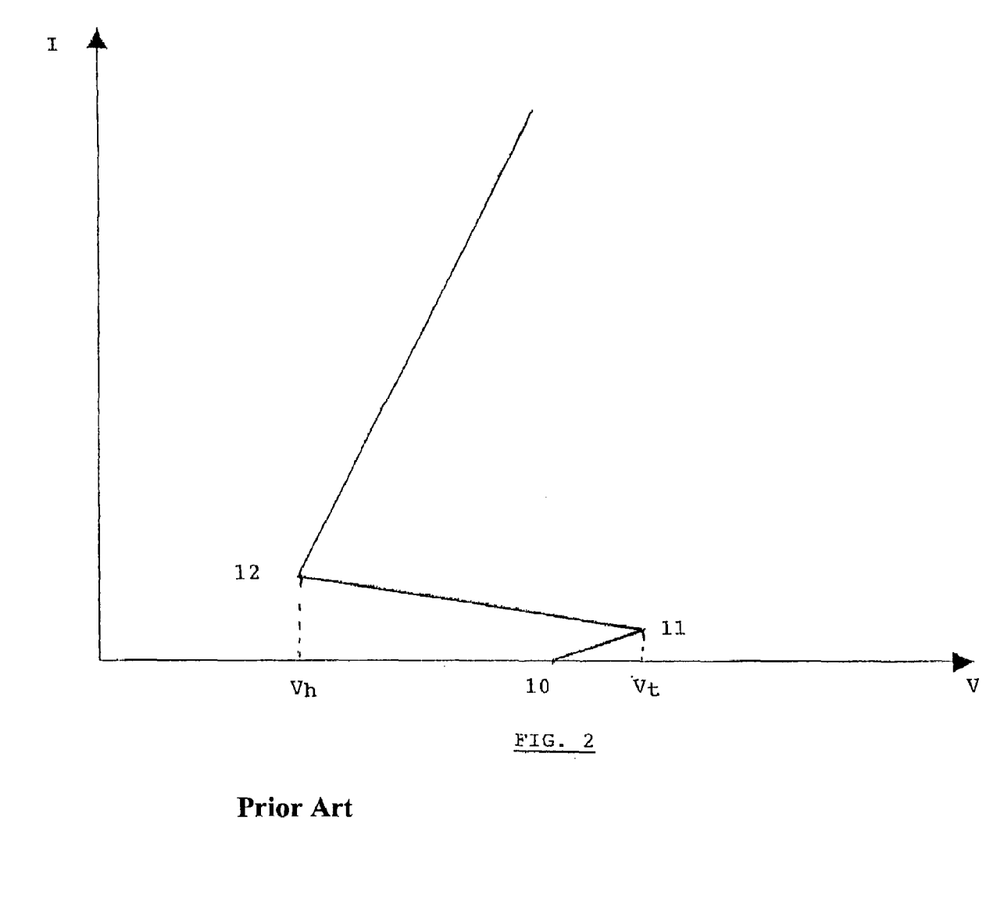
FIG. 2 is a graph illustrating a typical 'snap-back' I-V characteristic of the prior art ESD protection device shown in FIGS. 1a and 1b.

Referring now to FIG. 2, a graph illustrating the current-voltage (I-V) characteristics of the protection device of FIG. 1 is shown. As shown in FIG. 2, as the voltage on the $V_{DD}$ terminal 6 increases, the junction 7 between the collector 2 and the base 4 of the NPN transistor 1 breaks down (e.g., point 10 on FIG. 2), causing a current to flow from the base 4 to the emitter 3 through the conductor 5. Due to the internal resistance of the conductor 5, a voltage potential will build up between the base 4 and emitter 3. When this voltage potential reaches about 0.7V, the NPN transistor 1 turns on and eventually enters the snap-back mode (e.g., points 11 and 12 in FIG. 2). In this mode, starting from the point 12 in FIG. 2, the NPN transistor presents a low resistance between $V_{DD}$ terminal 6 and $V_{ss}$ terminal 8. Thus, the NPN transistor 1 is able to dissipate a large ESD current (which is very short in duration at about 100 ns for a human body model pulse), which would otherwise damage the protected devices were the NPN transistor 1 protection device not present.

The I-V characteristic curve shown in FIG. 2 is characterized by two important points: the snap-back point 11, corresponding to the so-called trigger voltage Vt, and the start of the low resistance mode at point 12, corresponding to the so-called holding voltage Vh. The holding voltage Vh depends on the particular manufacturing technology used to implement the protection device. For advanced semiconductor technologies it is not possible to achieve the high holding voltage requirements for a harsh automotive environment (e.g., 50V or more) by employing a single vertical bipolar NPN transistor (e.g., the NPN transistor 1). The protection device of FIG. 1 may have a holding voltage of around 25V at the most, which is insufficient with regard to the harsh automotive environment criteria discussed above. In order to achieve these criteria, the holding voltage needs to be, at a minimum, doubled.

Figure 3A:
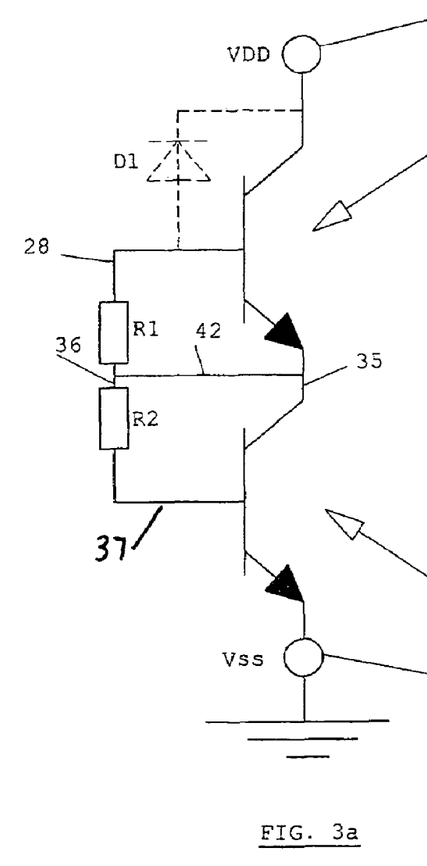
Figure 3B:
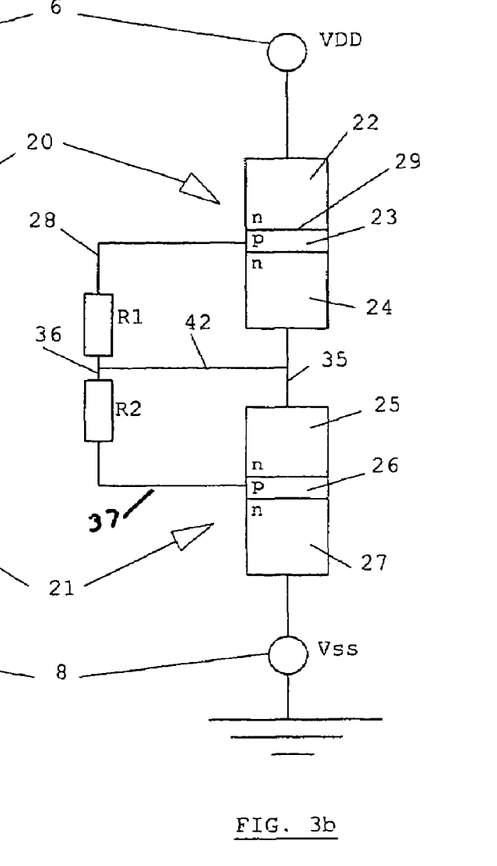

Referring now to FIG. 3, an ESD protection circuit that satisfies the criteria discussed above is shown. FIG. 3a is an electrical schematic diagram of the protection circuit, while FIG. 3b is a diagram illustrating the physical elements of the protections circuit. The circuit includes two bipolar transistors 20,21 in series. Other embodiments may include additional bipolar transistors in series with the transistors 20,21, such as the embodiment described below with reference to FIG. 8. The protection circuit shown in FIGS. 3a and 3b, depending on the specific design parameters, may have a holding voltage of at least 50V, and a trigger voltage of less than 80V.

As illustrated in FIGS. 3a and 3b, the bases 23,26 of the transistors 20,21 are coupled with one another via two resistors R1,R2, which are arranged in serial fashion. The collector 22 of the transistor 20 is coupled with a $V_{DD}$ terminal 6, which is to be biased with a power supply voltage for the electronic circuit being protected, when that circuit is in operation. The emitter 24 of the transistor 20 is coupled with the collector 25 of the transistor 21 through a connector 35. The emitter 27 of the transistor 21 is coupled with a $V_{ss}$ terminal 8, which is to be biased to a reference voltage, typically electrical ground, for the electronic circuit being protected, when that circuit is in operation.

The base 23 of the bipolar transistor 20 is coupled with the resistor R1 by a connector 28. The resistor R1 is coupled with the resistor R2 by a connector 36. The resistor R2 is further coupled with the base 26 of the transistor 21 with a connector 37. Furthermore, the connector 36 (coupling the resistors R1 and R2) is coupled with the connector 35 (coupling the emitter 24 of the transistor 20 with the collector 25 of the transistor 21) with a connector 42.

The protection circuit illustrated in FIGS. 3a and 3b operates as follows. In the off state, a collector/base junction 29 of the transistor 20 sustains the complete voltage between the $V_{DD}$ terminal 6 and the $V_{ss}$ terminal 8. The junction 29 is represented by the collector-base diode D1 in FIG. 3a. When the junction 29 breaks down (e.g., due to a high voltage across the junction 29 associated with an ESD event), a current (avalanche breakdown current) flows through the junction 29 to the base 26 of the transistor 21 (through the resistors R1,R2), which will then go into the on-state (conducting state). When the avalanche current reaches a certain value, the transistor 20 goes into snap-back mode. The steep voltage decrease across the transistor 20 is then compensated for by a voltage drop across transistor 21 which is still in the on-state. The magnitude of this voltage drop depends on the amount of current flowing to the base 26 of the transistor 21 (which affects how much current the transistor 21 conducts. The amount of current flowing to the base 26 of the transistor 21 is controlled by the values of the resistors R1 and R2. At higher base current levels, the transistor 21 will also operate in a low impedance/high current regime. Therefore, both transistors will now be operating in this high current regime, which is desirable to dissipate the current associated with an ESD event. In this state, the total voltage is then equally divided over the transistors 20,21.

Figure 4:
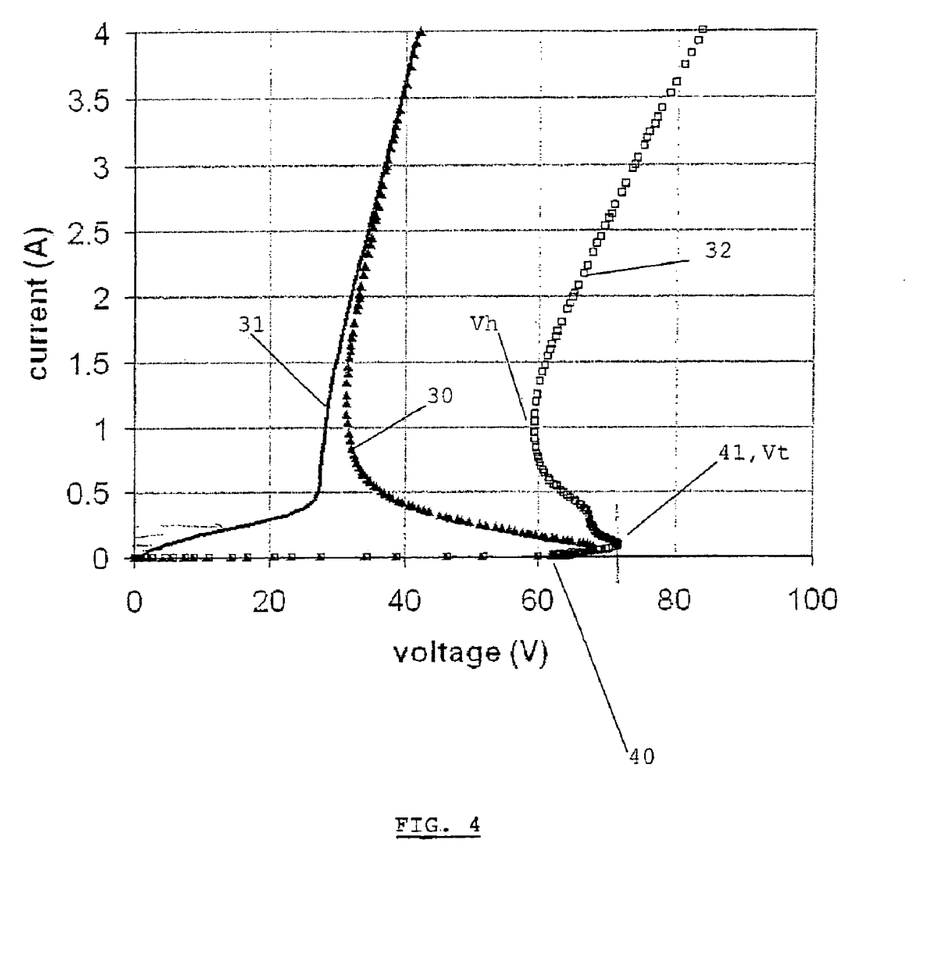
FIG. 4 is a graph illustrating the I-V characteristic of an ESD protection device in accordance with an embodiment of the invention.

Referring to FIG. 4, a graph illustrating the IV-characteristic of the device of FIGS. 3a and 3b is shown by a curve 32. The curve 32 is the sum of curves 30 and 31, which represent the individual behavior of transistors 20,21 respectively. The curve 31 will develop only when the total voltage reaches point 40. At this point, the junction diode D1 (as illustrated in FIG. 3a) goes into breakdown, thus causing the transistor 21 to start conducting, developing a voltage represented by the curve 31. Since this voltage is low at the initial low current levels, the total triggering voltage Vt, reached when transistor 20 goes into snap-back (point 41) will not be high, thus avoiding overshoot problems.

At higher current levels, the holding voltage Vh is the sum of the holding voltage of the transistor 20 in snap-back, and the voltage over transistor 21, which is higher at higher current levels, making the total holding voltage Vh higher than in the case of the single transistor protection device illustrated in FIGS. 1a and 1b. In the device illustrated in FIGS. 3a and 3b, the connection 42 allows the current flowing from the base of the transistor 20 to be diverted into the collector 25 of the transistor 21. This diversion of current allows for directly controlling the voltage across transistor 21 via the value of the resistor R2.

Alternative ESD Protection Circuits

The protection circuit illustrated in FIGS. 3a and 3b, through the proper selection of resistance values for the resistors R1 and R2, as well as the design parameters of the transistors 20,21, may achieve the harsh environment performance criteria described above (e.g., a holding voltage of at least 50V, a triggering voltage with a maximum of 80V, and the power dissipation capability to withstand ESD events). However, additional components may be added to the protection circuit of FIGS. 3a and 3b in order to further enhance its performance.

Figure 5:
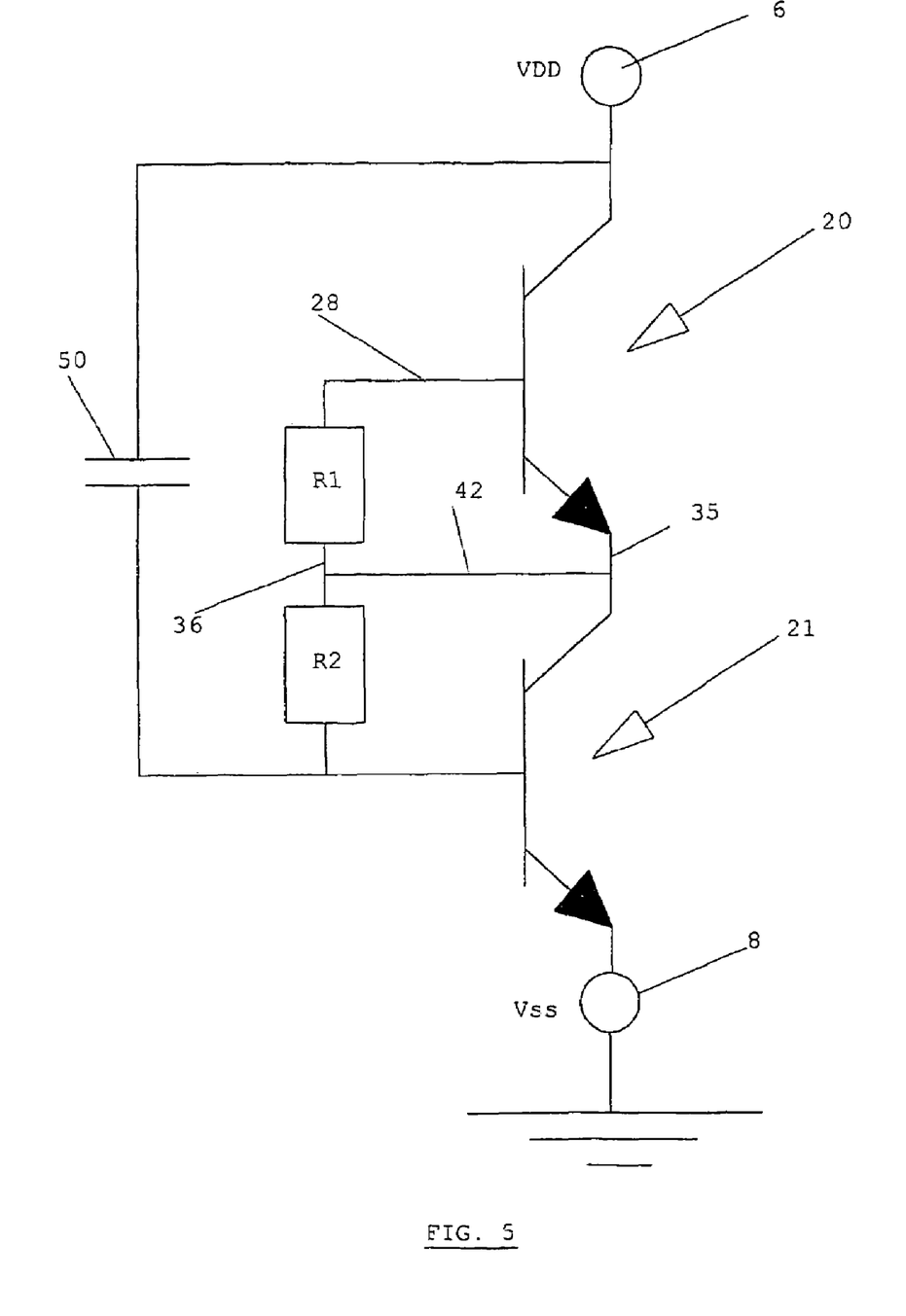
FIGS. 5 and 6 are schematic diagrams illustrating alternative embodiments of ESD protection devices in accordance with embodiments of the invention.

Referring to FIG. 5, a capacitor 50 is added between the collector 22 of transistor 20 and the base 26 of transistor 21. The capacitor 50 operates so as to limit the dynamic overshoot and reduce erroneous triggering of the circuit.

Figure 6:
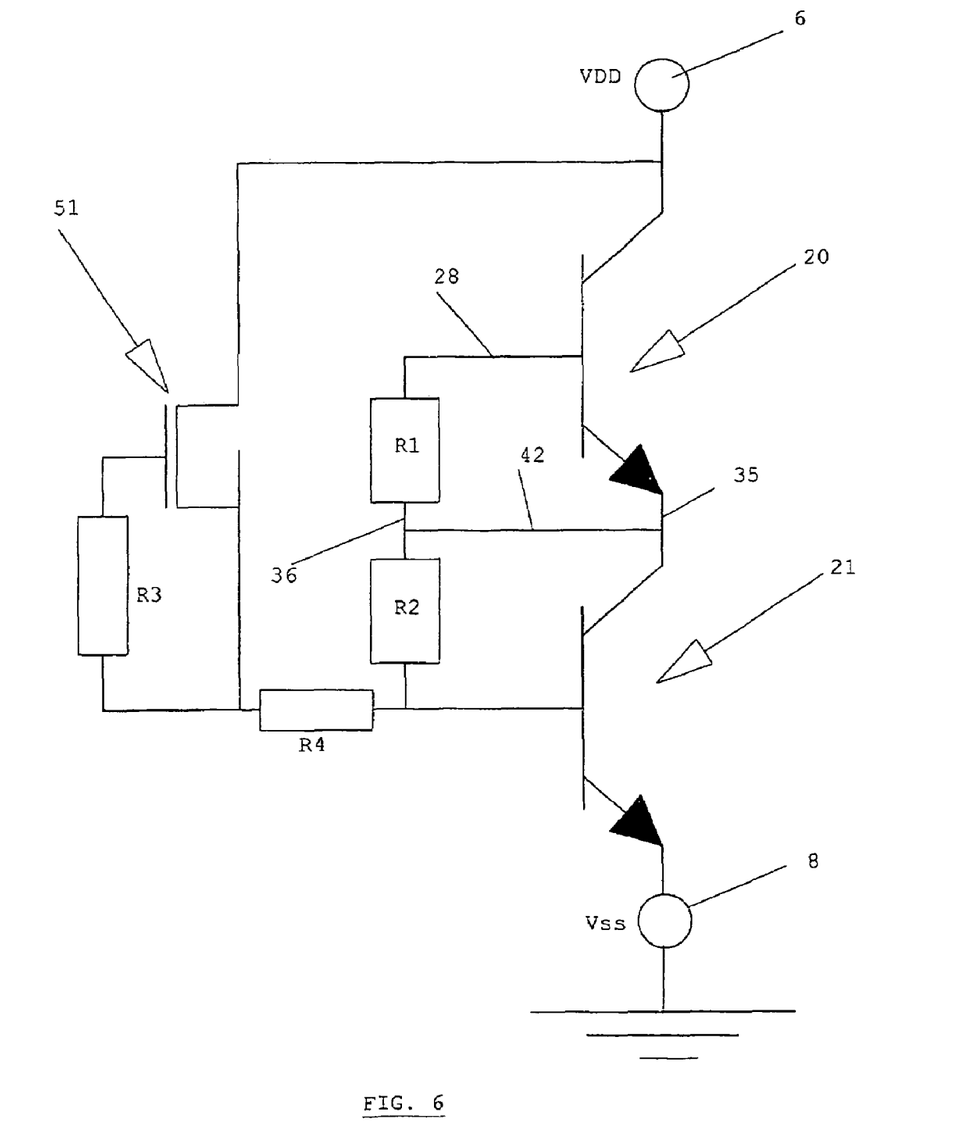

Referring to FIG. 6, the protection circuit of FIGS. 3a and 3b is modified to include a gate-coupled vertical-DMOS (VDMOS) transistor 51. The VDMOS transistor 51 is coupled between the collector 22 of the transistor 20 and the base 26 of the transistor 21. A resistor R3 is also added. The resistor R3 acts as an external gate resistance to implement the gate coupled VDMOS 51, which triggers via drain-to-gate coupling during the rising edge of an ESD event. A resistor R4 acts as a current limiter to avoid full discharge through the VDMOS 51 when it goes into snap-back mode.

Integrated Circuit Layout Cross-section of an ESD Protection Circuit

Figure 7:
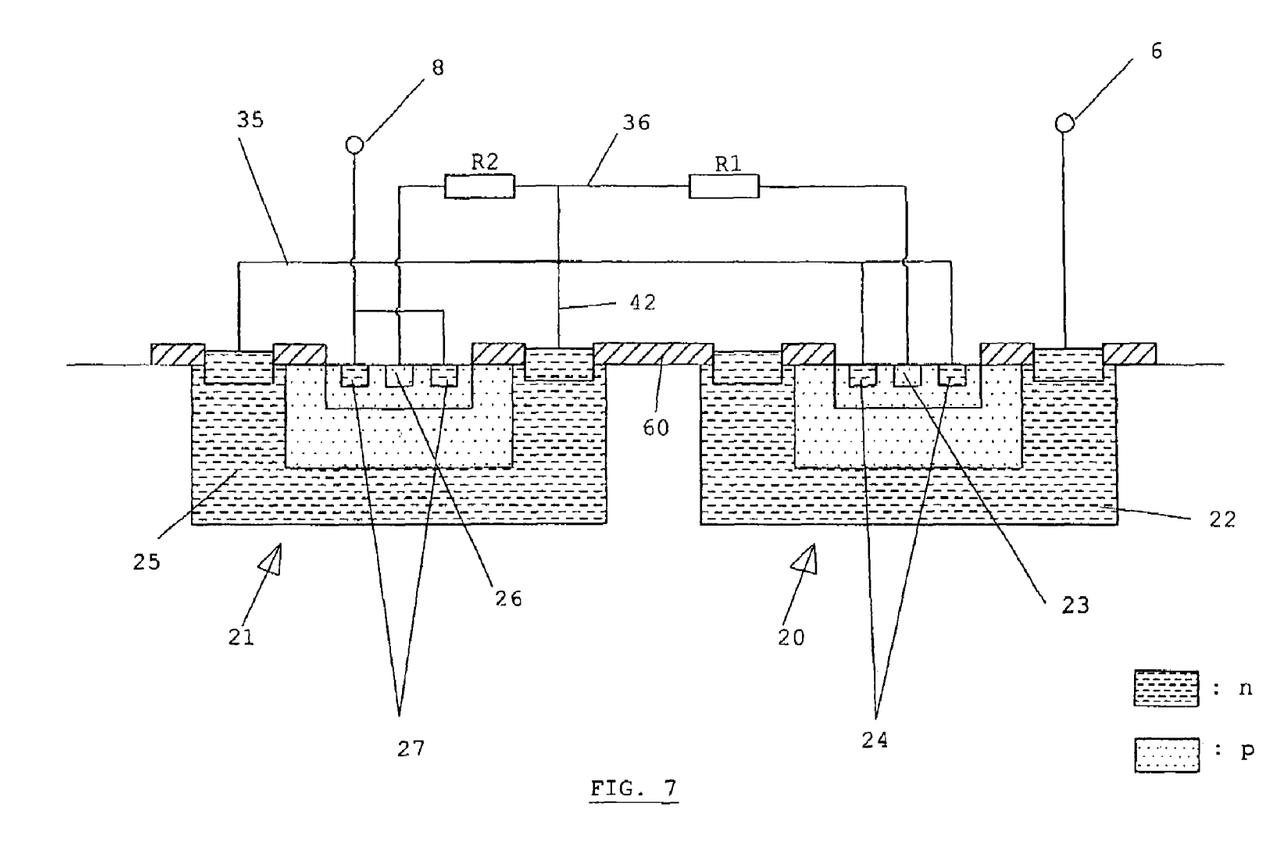
FIG. 7 cross-sectional view of an ESD protection device implemented in an integrated circuit in accordance with an embodiment of the invention.

Referring to FIG. 7, a diagram illustrating a cross-sectional view of an ESD protection circuit is shown. The same numerals are used in FIG. 7 that were used in FIGS. 3a and 3b to indicate the same elements. The NPN transistors 20, 21 are of the symmetrical type, each having two emitters and two collectors. The isolation between the two transistors may be obtained by any number of known techniques, such as, by using a field oxide 60. An ESD pulse may arrive at the terminal 6 (e.g., $V_{DD}$ terminal). The connector 35 couples the emitter of the transistor 20 with the collector of the transistor 21, as in FIGS. 3a and 3b. Similarly, the connector 42 couples the connector 35 with the connector 36 (between the resistors R1 and R2). It will be appreciated that other physical implementations of the transistors 20,21 may be used. For example, ESD protection circuit (such as illustrated in FIGS. 3a and 3b) may be implemented by combining "parasitic" bipolar transistors, which, as was previously discussed, are formed inherently in an NMOS/DMOS structure. Such parasitic bipolar transistors are formed as a result of an n-implant of the source and drain, acting as the emitter and collector, and the p-well/p-body acting as the base (for NPN transistors).

Figure 8:
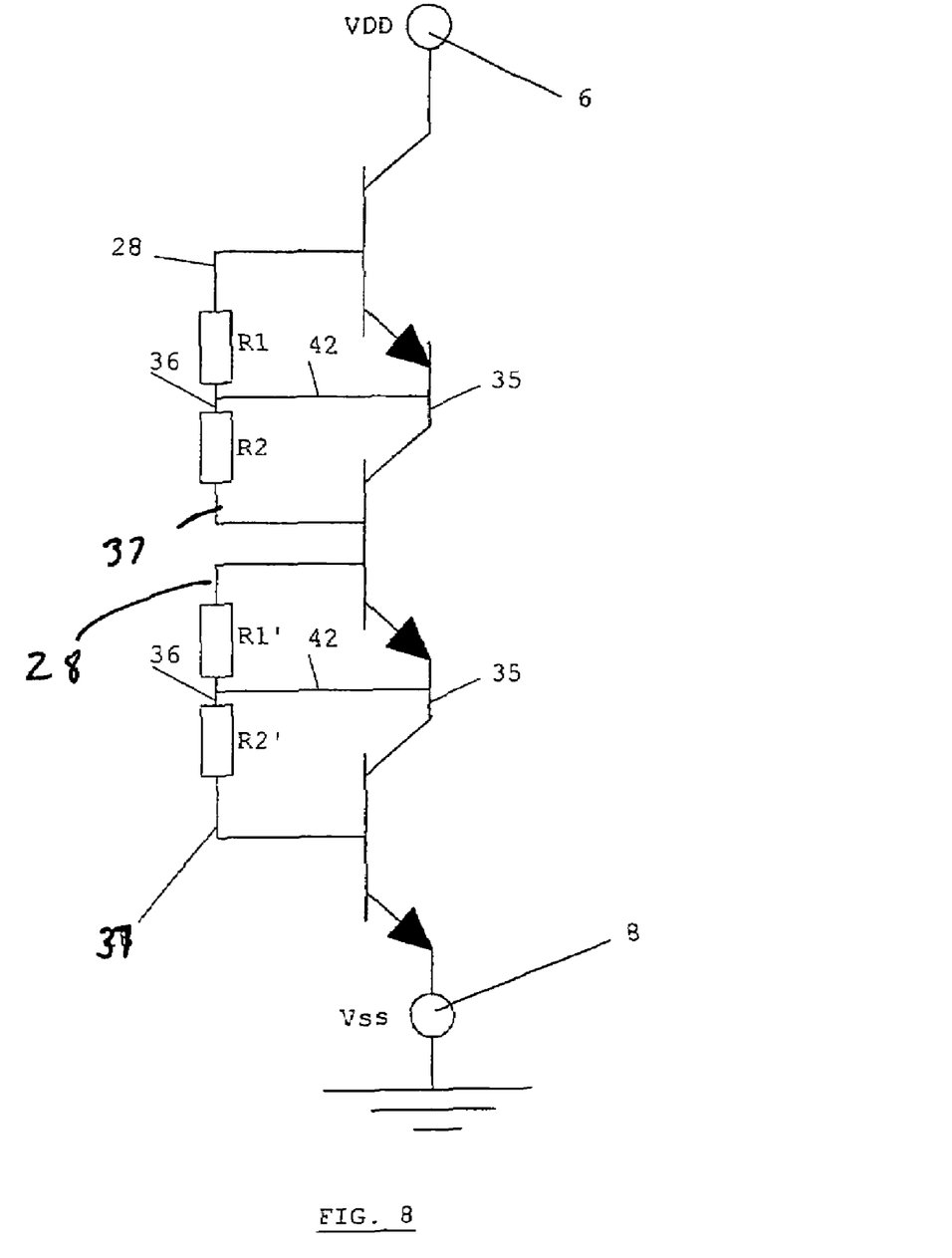
FIG. 8 is a schematic diagram illustrating another alternative ESD protection device in accordance with an embodiment of the invention.

Referring to FIG. 8, an ESD protection circuit with three transistors in series is shown. During operation in response to an ESD event, the upper transistor in FIG. 8 will go into snap-back, thus causing both of the lower transistors to be activated. In the protection circuit of FIG. 8 the bases of every two neighboring transistors in the series, are coupled via two resistors in similar fashion as shown in FIGS. 3a and 3b. In FIG. 8, these connections include, respectively the resistor pairs R1/R2 and R1'/R2'. Further, the connectors 36 (between the resistor pairs) are coupled with the connectors 35 (between the adjacent transistors) with the connectors 42. A capacitor or DMOS transistor between the terminal 6 and the base of every transistor in the series may be alternatively implemented as well. The holding voltage of the device of FIG. 8 is determined by the combined effect of the three transistors, and may be tuned, for example, through the choice of the values of the resistors R1/R2 and R1'/R2'.

What is claimed is:

1. A protection circuit for protecting an electronic circuit from an electrostatic discharge (ESD) event, the electronic circuit, in operation, being supplied a supply voltage via a supply voltage terminal, with respect to a reference voltage, the reference voltage being supplied via a reference voltage terminal, the protection circuit comprising:

a set of at least two bipolar transistors coupled in series, each two neighboring transistors being coupled with respective first connections between a collector of one transistor and an emitter of the other transistor, the set of at least two transistors being further coupled with the supply voltage terminal and the reference voltage terminal, a first of the transistors being directly coupled with the supply voltage terminal and a second of the transistors being directly coupled with the reference voltage terminal, wherein the bases of every two neighboring transistors are interconnected by respective second connections, wherein the second connections between the bases each consist of two resistances coupled in series through respective third connections, and wherein respective fourth connections couple the respective first and third connections.

2. The protection circuit of claim 1, wherein set of bipolar transistors comprises a set of NPN transistors.

3. The protection circuit of claim 1, wherein the set of bipolar transistors comprises a set of PNP transistors.

4. The protection circuit of claim 1, further comprising one or more capacitors, each capacitor being coupled between the supply voltage terminal, to which one of the transistors is directly connected, and the base of one or more of the other transistors.

5. A device according to claim 1, further comprising one or more gate coupled double-diffused metal-oxide-semiconductor (DMOS) transistors, each DMOS transistor being coupled between the supply voltage terminal, to which one of the transistors is directly connected, and the base of one or more of the other transistors.

6. An electronic device that, in operation, is supplied a supply voltage via a supply voltage terminal, with respect to a reference voltage, and the reference voltage is supplied via a reference voltage terminal, the electronic device including a protection circuit comprising:
   a set of at least two bipolar transistors coupled in series, each two neighboring transistors being coupled with respective first connections between a collector of one transistor and an emitter of the other transistor, the set of at least two transistors being further coupled with the supply voltage terminal and the reference voltage terminal, a first of the transistors being directly coupled with the supply voltage terminal and a second of the transistors being directly coupled with the reference voltage terminal,
   wherein the bases of every two neighboring transistors are interconnected by respective second connections,
   wherein the second connections between the bases each consist of two resistances coupled in series through respective third connections, and
   wherein respective fourth connections couple the respective first and third connections.

7. An electrostatic discharge (ESD) protection circuit comprising:
   a first NPN transistor;
   a second NPN transistor, wherein a collector of the second NPN transistor is coupled with an emitter of the first NPN transistor via a first connector;
   a first resistor having a first terminal and a second terminal, wherein the first terminal of the first resistor is coupled with a base of the first NPN transistor via a second connector;
   a second resistor having a first terminal and a second terminal, wherein the first terminal of the second resistor is connected to the second terminal of the first resistor via a third connector and the second terminal of the second resistor is coupled with a base of the second NPN transistor via a fourth connector; and
   a fifth connector coupling the first connector with the third connector.

8. The ESD protection circuit of claim 7, wherein a collector of the first NPN transistor is coupled with a power supply terminal of an electronic circuit and an emitter of the second NPN transistor is coupled with a reference voltage terminal of the electronic circuit.

9. The ESD protection circuit of claim 7, wherein the electronic circuit comprises an integrated circuit.

10. The ESD protection circuit of claim 7, wherein the power supply terminal comprises a power supply bus and the reference voltage terminal comprise a reference voltage bus.

11. The protection circuit of claim 7, wherein respective resistance values of the first and second resistors are selected such that the protection circuit has a holding voltage of greater than 50 volts.

12. The protection circuit of claim 7, further comprising:
   a third NPN transistor, wherein a collector or the third NPN transistor is coupled with an emitter of the second NPN transistor via a sixth connector;
   a third resistor having a first terminal and a second terminal, wherein the first terminal of the third resistor is coupled with the base of the second NPN transistor via a seventh connector;
   a fourth resistor having a first terminal and a second terminal, wherein the first terminal of the fourth resistor is coupled with the second terminal of the third resistor via an eighth connector and the second terminal of the fourth resistor is coupled with a base of the third NPN transistor via a ninth connector; and
   a tenth connector coupling the sixth connector with the eighth connector.

13. The circuit of claim 7, further comprising a capacitor having a first terminal and a second terminal, wherein the first terminal of the capacitor is coupled with a collector of the first NPN transistor and the second terminal of the capacitor is coupled with the base of the second transistor.

14. The circuit of claim 7, further comprising a double-diffused metal-oxide-semiconductor (DMOS) transistor having a drain, a source and a gate, the drain being coupled with a collector of the first NPN transistor, the source being coupled with tie base of the second NPN transistor, and the gate being coupled with the base of the second NPN transistor.

15. The protection circuit of claim 14, wherein the DMOS transistor comprises a gate-coupled vertical-DMOS (VDMOS) transistor.

16. The protection circuit of claim 14, wherein tie gate of the VDMOS transistor is coupled with the base of the second NPN transistor via a third and a fourth resistor and the source of the VDMOS transistor is coupled with the base of the second NPN transistor via the fourth resistor.

17. A method of protecting an electronic circuit from an electrostatic discharge (ESD) event, the method comprising:
   providing a protection circuit coupled between a supply voltage terminal and a reference voltage terminal of the electronic circuit;
   receiving an ESD pulse at a base-collector junction of a first NPN transistor of the protection circuit, the ESD pulse causing breakdown of the base-collector junction, resulting in snap-back of the first NPN transistor;
   communicating current from the base of the first NPN transistor to a base of a second NPN transistor using a voltage divider consisting of a first resistance and a second resistance;
   diverting at least a portion of the current between the first resistance and the second resistance to an emitter of the first NPN transistor and a collector of the second NPN transistor; and
   controlling the current communicated from the base of the first NPN transistor to the base of the second NPN transistor with resistance values of the first resistance and the second resistance.

18. The method of claim 17, further comprising controlling dynamic overshoot signals from the supply voltage terminal applied to the base of the second NPN transistor.

* * * * *